United States Patent [19]
McEldowney

[11] Patent Number: 6,140,872
[45] Date of Patent: Oct. 31, 2000

[54] OFFSET-COMPENSATED AMPLIFIER INPUT STAGE AND METHOD

[75] Inventor: Justin A. McEldowney, Tucson, Ariz.

[73] Assignee: Burr-Brown Corporation, Tucson, Ariz.

[21] Appl. No.: 09/428,947

[22] Filed: Oct. 28, 1999

[51] Int. Cl.[7] .............................. H03F 1/02; H03F 3/45; H03L 5/00

[52] U.S. Cl. ............................... 330/9; 330/253; 327/307

[58] Field of Search ....................... 330/9, 253; 327/124, 327/307, 554

[56] References Cited

U.S. PATENT DOCUMENTS

| | | | |
|---|---|---|---|
| 3,873,933 | 3/1975 | Wheatley, Jr. | 330/30 |
| 3,932,768 | 1/1976 | Takahashi et al. | 307/237 |
| 3,988,689 | 10/1976 | Ochi et al. | 330/9 |
| 3,991,380 | 11/1976 | Pryor | 330/13 |
| 4,048,575 | 9/1977 | Musa | 330/253 |
| 4,050,030 | 9/1977 | Russell | 330/23 |
| 4,156,283 | 5/1979 | Gilbert | 364/841 |
| 4,333,057 | 6/1982 | Hoover | 330/253 |
| 4,345,213 | 8/1982 | Schade, Jr. | 330/253 |
| 4,423,385 | 12/1983 | Evans | 330/9 |
| 4,460,874 | 7/1984 | Haque | 330/261 |
| 4,462,002 | 7/1984 | Schade, Jr. | 330/253 |
| 4,605,907 | 8/1986 | Rosenthal et al. | 330/257 |
| 4,754,169 | 6/1988 | Morris | 307/355 |
| 4,902,984 | 2/1990 | Vinn et al. | 330/252 |
| 4,929,908 | 5/1990 | Imanishi | 330/254 |
| 4,933,642 | 6/1990 | Lee | 330/9 |
| 4,987,379 | 1/1991 | Hughes | 330/253 |
| 4,992,755 | 2/1991 | Seevinck et al. | 330/253 |
| 5,047,665 | 9/1991 | Burt | 307/355 |
| 5,047,727 | 9/1991 | Theus | 330/9 |
| 5,386,160 | 1/1995 | Archer et al. | 327/307 |
| 5,404,058 | 4/1995 | Nishijima | 327/332 |
| 5,455,816 | 10/1995 | Bitting | 369/124 |
| 5,546,041 | 8/1996 | Szajda | 327/512 |
| 5,568,092 | 10/1996 | Shimizu et al. | 330/260 |
| 5,568,438 | 10/1996 | Penchuk | 365/208 |
| 5,666,087 | 9/1997 | Gorecki | 330/260 |
| 5,729,178 | 3/1998 | Park et al. | 330/258 |
| 5,764,103 | 6/1998 | Burra et al. | 330/51 |
| 5,798,664 | 8/1998 | Nagahori et al. | 327/307 |
| 5,812,005 | 9/1998 | Ezell et al. | 327/307 |
| 6,002,299 | 12/1999 | Thomsen | 330/9 |

*Primary Examiner*—Robert Pascal
*Assistant Examiner*—Patricia T. Nguyen
*Attorney, Agent, or Firm*—Cahill, Sutton & Thomas P.L.C.

[57] ABSTRACT

An offset-compensated amplifier including an input stage (2) having a current source (10), first (11) and second (12) FETs each having a source connected to the current source, first (17) and second (18) input FETs each having a source connected to a drain of the first compensation FET (11), and third (19) and fourth (20) input FETs each having a source connected to a drain of the second compensation FET (12), a drain of each of the first (17) and third (19) input FETs being connected by a first output conductor (21) to a first load (23), and a drain of each of the second (18) and fourth (20) input FETs being connected by a second output conductor (22) to a second load (24), a gate of each of the first (17) and third (19) input FETs being connected to a first input (3A), a gate of each of the second (18) and fourth (20) FETs being connected to a second input (3B). Auto-zeroing circuitry (3) including switching circuitry (32A, 32B) operative to short-circuit the first (3A) and second (3B) inputs to cause the input stage (2) to produce a gained-up offset voltage between the first (21) and second (22) output conductors, switched capacitor circuitry (26A, 26B, 27A, 27B) operative to store the gained-up offset voltage, and compensation circuitry (28) operative to apply compensation signals to the gates of the first (11) and second (12) compensation FETs in response to the stored gained-up offset voltage.

19 Claims, 5 Drawing Sheets

FIG. 3
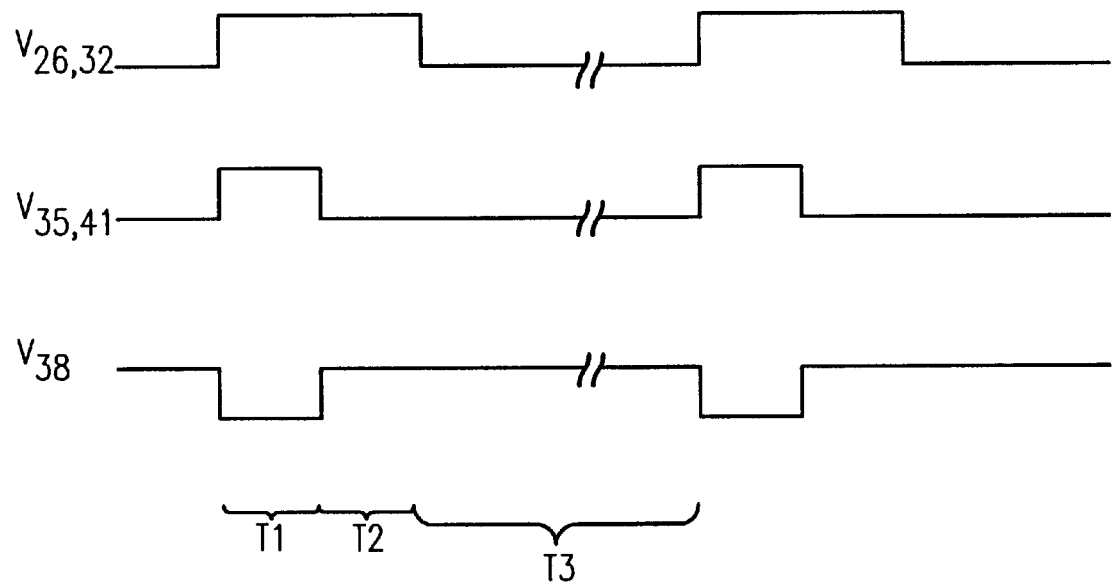
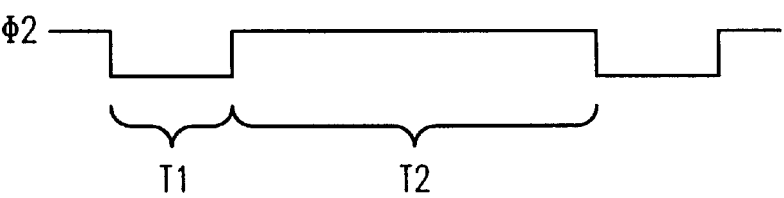
FIG. 5

6,140,872

OFFSET-COMPENSATED AMPLIFIER INPUT STAGE AND METHOD

BACKGROUND OF THE INVENTION

The invention relates to auto-zeroing circuitry for correcting the effects of input offset voltage in the input stage of a differential amplifier.

Several techniques have been widely used to reduce or eliminate the effects of the DC input offset voltage in the input stage of a differential amplifier. The input offset voltage is due to a mismatch in input turn-on voltages of a pair of differentially connected input transistors in the input stage of the differential amplifier. If the two input signals are short-circuited together, the output voltage of the differential amplifier will be zero only if the offset voltage is zero. If the offset voltage is not zero, then when the input terminals are shorted together the amplifier output voltage will be equal to the offset voltage multiplied by the gain of the differential amplifier.

One common technique for compensating the input offset voltage of an amplifier is to laser trim thin film load resistors of the input stage enough to cause the output voltage to be zero when the differential input voltage is zero. However, laser trimming is an expensive, time consuming procedure which is to be avoided if possible. In another technique referred to as "chopper stabilization", the connections of the input signal are repeatedly reversed between the (+) and (−) input terminals of the differential input stage by operating chopper switches in response to a chopper clock signal, and the connections of the amplifier output signal to the (+) and (−) outputs of the output stage also are alternately reversed in synchronization with the chopper clock signal. Another known offset compensation technique, shown in U.S. Pat. No. 4,933,642 (Lee), U.S. Pat. No. 4,622,521 (Redfern), and U.S. Pat. No. 3,988,689 (Ochi et al.), includes sampling the output voltage of the differential input stage of the amplifier onto a capacitor and then applying the sampled voltage on the capacitor to the inputs of a second differential stage, the outputs of which are used to compensate the output signal of the differential amplifier so as to eliminate the effect of the offset voltage. The known chopper stabilization and auto-zeroing techniques typically result in an undesirable amount of switching noise being generated at the amplifier inputs and propagating to the amplifier output after being amplified by the gain of the amplifier. There is an unmet need for a technique for adjusting various parameters of an amplifying circuit, including an input offset voltage thereof, without the need for laser trimming or other mechanical trimming or circuit components.

SUMMARY OF THE INVENTION

Accordingly, it is an object of the invention to provide a differential amplifier circuit with essentially zero input offset voltage without a laser trimming operation.

It is another object of the invention to provide a differential amplifier including auto-zeroing circuitry that substantially avoids amplification of switching noise.

It is another object of the invention to provide circuitry for adjusting the input offset voltage of a circuit or system so as to allow dynamic correction during operation and/or for system calibration.

It is another object of the invention to provide a circuit and technique for avoiding laser trimming or other mechanical trimming operation to adjust a parameter, such as input offset voltage, of a circuit including a differential stage.

It is another object of the invention to provide a circuit and technique for adjusting/correcting a circuit parameter to compensate for various "system" errors, such as unbalanced charge injection, occurring in various parts of a system including one or more differential amplifying stages.

It is another object of the invention to provide an improved technique for inputting a correction signal into a differential amplifying stage so as to avoid the need for laser trimming or other mechanical trimming of circuit components.

It is another object of the invention to provide a comparator circuit having hysteresis.

Briefly described, and in accordance with one embodiment thereof, the invention provides an offset-compensated amplifier (1) including an input stage (2) with a tail current source (10), and first (11) and second (12) compensation transistors each having a first electrode coupled to the tail current source, and first (17) and second (18) input transistors each having a first electrode coupled to a second electrode of the first compensation transistor (11), and third (19) and fourth (20) input transistors each having a first electrode coupled to a second electrode of the second compensation transistor (12). A second electrode of each of the first (17) and third (19) input transistors is coupled by a first output conductor (21) to a first load device (23), and a second electrode of each of the second (18) and fourth (20) input transistors is coupled by a second output conductor (22) to a second load device (24). A control electrode of each of the first (17) and third (19) transistors is coupled to a first input terminal (3A), and a control electrode of each of the second (18) and fourth (20) transistors is coupled to a second input terminal (3B). Auto-zeroing circuitry (4) coupled to the first (3A) and second (3B) input terminals and the first (21) and second (22) output conductors includes switching circuitry (32A,32B) operative to short-circuit the first (3A) and second (3B) input terminals together to cause the input stage (2) to produce a signal representative of a gained-up offset voltage. The auto-zeroing circuitry includes switched capacitor sample-and-hold circuitry (26A,26B,27A,27B) operative to store the signal representative of gained-up offset voltage which is further amplified by an extra gain stage (28) or servo amplifier to apply compensation signals to the control electrodes of the first (11) and second (12) compensation transistors.

In one embodiment, the auto-zeroing circuitry (4) also includes first (32A) and second (32B) auto-zeroing switches that are operative to short-circuit the first (3A) and second (3B) input terminals together. A second gain stage (25) having inputs coupled to the first (21) and second (22) conductors has outputs coupled by first (38A) and second (38B) auto-zeroing switches to inputs of a servo amplifier (28). Outputs of the servo amplifier are coupled by third (26A) and fourth (26B) auto-zeroing switches to a first capacitor (27A) and a second capacitor (27B), respectively, to sample and hold voltages produced on first and second outputs of the servo amplifier (28). In the described embodiments, the first and second compensation transistors and the first, second, third, and fourth input transistors are field effect transistors, each first electrode, second electrode, and control electrode being a source electrode, drain electrode, and gate electrode, respectively. In one embodiment, positive, feedback is added during the normal operational cycle to provide hysteresis to implement a comparator as well as the use of negative feedback from the output of the differential input stage to correct for offset errors as described above.

BRIEF DESCRIPTION OF THE DRAWINGS

FIG. 3 is a timing diagram useful in describing the operation of the circuit of FIG. 1.

FIG. 5 is a timing diagram useful in describing the operation of the embodiment of FIG. 4.

DETAILED DESCRIPTION OF THE PREFERRED EMBODIMENTS

Figure 1:
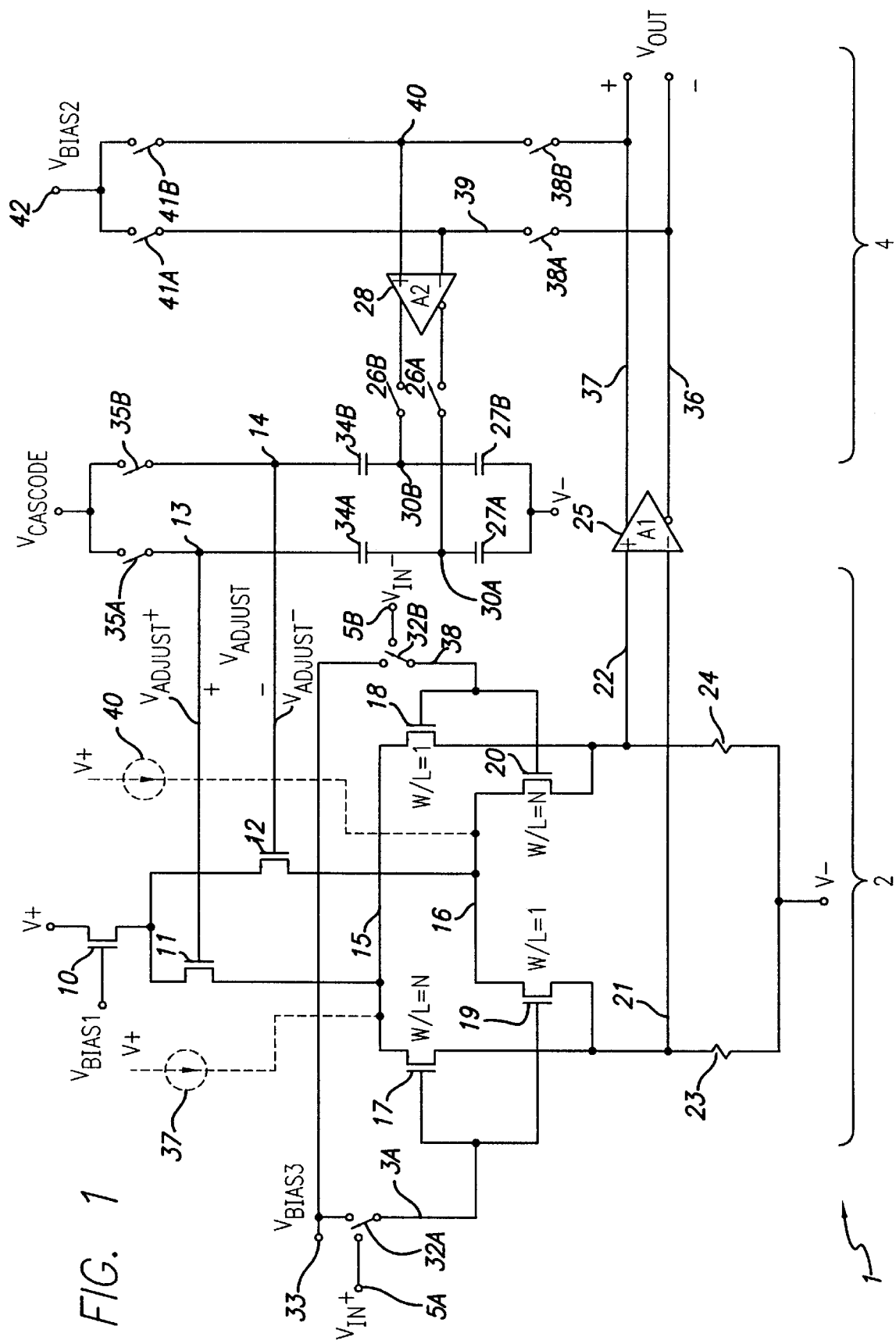
FIG. 1 is a schematic diagram of a differential amplifier including circuitry for compensating input offset voltage of an input stage thereof.

Referring to FIG. 1, differential amplifier 1 includes differential input stage 2 and auto-zeroing circuit 4. Input stage 2 includes a P-channel MOSFET 10 that supplies a constant current into the source electrodes of a pair of P-channel "adjustment" or "compensation" MOSFETs 11 and 12. The gates of MOSFETs 11 and 12 are connected to conductors 13 and 14 to receive therebetween a differential adjustment voltage $V_{ADJUST}=V_{ADJUST}^{+}-V_{ADJUST}^{-}$. The drain electrode of MOSFET 11 is connected by a conductor 15 to the source electrodes of a first pair of P-channel input MOSFETs 17 and 18. Similarly, the drain of MOSFET 12 is connected by conductor 16 to the sources of a second pair of P-channel input MOSFETs 19 and 20.

The channel-width-to-channel-length ratio (i.e., the W/L ratio) of input MOSFET 17 is greater than that of input MOSFET 18 by a suitable ratio of N, which for example can be 2. The W/L ratios of input MOSFETs 19 and 20 are reversed from those of input MOSFETs 17 and 18. For example, the W/L ratios of input MOSFETs 17 and 18 can be 2 and 1, respectively, in which case the W/L ratios of input MOSFETs 19 and 20 are 1 and 2, respectively. The gate electrode of input MOSFET 17 is connected by conductor 3A to the pole terminal of single pole, double throw (SPDT) auto-zeroing switch 32A to receive either input signal $V_{IN}^{+}$ on input terminal 5A or the bias voltage $V_{BIAS3}$ on conductor 33. The gate electrodes of input MOSFETs 18 and 20 are connected by conductor 3B to the pole of SPDT auto-zeroing input switch 32B to receive either $V_{IN}^{-}$ on input terminal 5B or $V_{BIAS3}$ on conductor 33.

The drain electrodes of input MOSFETs 17 and 19 are connected to (−) output conductor 21 of input stage 2, and the drain electrodes of input MOSFETs 18 and 20 are connected to (+) output conductor 22. Output conductors 21 and 22 are connected, respectively, to load devices 23 and 24, which can be ordinary current sources or resistors. Input stage 2 produces a differential output voltage $V_{OUT}$ between output conductors 21 and 22. Alternatively, load devices 23 and 24 can be current mirror transistors or folded cascode transistors, in which case a differential output current is produced between conductors 21 and 22.

Auto-zeroing circuitry 4 includes above mentioned input switches 32A and 32B, second stage amplifier 25, switches 38A and 38B, "servo" amplifier 28, sample-and-hold switches 26A and 26B, sample-and-hold capacitors 27A and 27B, voltage level shifting capacitors 34A and 34B, and precharge switches 35A and 35B. Output conductors 21 and 22 of differential input stage 2 are connected to the (+) and (−) inputs, respectively, of second stage amplifier 25, which has an open loop gain of A1. The (+) and (−) output conductors 36 and 37 of amplifier 25 are connected to the pole terminals of secondary auto-zeroing switches 38A and 38B, respectively. The other terminals of switches 38A and 38B are connected by conductors 39 and 40 to the (−) and (+) inputs, respectively, of a servo amplifier 28. The (+) and (−) outputs of servo amplifier 28 are connected to first terminals of sample-and-hold switches 26B and 26A, respectively. The second terminals of sample-and-hold switches 26A and 26B are connected by conductors 30A and 30B to a first terminal of each of sample and hold (S/H) capacitors 27A and 27B, respectively. A second terminal of each of sample-and-hold capacitors 27A and 27B is connected to an AC ground, which in this case is V−.

Conductors 30A and 30B also are coupled by level shifting capacitors 34A and 34B to conductors 13 and 14, respectively. Conductor 13 is connected to a first terminal of switch 35A and conducts an adjustment voltage $V_{ADJUST}^{+}$. Conductor 14 is connected to a first terminal of switch 35B and conducts an adjustment voltage $V_{ADJUST}^{-}$. A second terminal of each of switches 35A and 35B is connected to a cascode bias voltage $V_{CASCODE}$. $V_{ADJUST}$ is the voltage difference between conductors 13 and 14.

FIG. 3 shows three signal waveforms $V_{26,32}$, $V_{35,41}$, and $V_{38}$. $V_{26,32}$ closes switches 26A and 26B during T1 and T2 when it is at a "1" level. $V_{26,32}$ also connects internal input conductors 3A and 3B to conductor 33 during intervals T1 and T2, thereby short-circuiting the inputs of differential stage 2 together to $V_{BIAS3}$ during T1 and T2. $V_{26,32}$ connects internal input conductors 3A and 3B to external input conductors 5A and 5B, respectively, during T3. $V_{35,41}$ closes switches 35A and 35B and 41A and 41B during T1. $V_{38}$ causes switches 38A and 38B to be open during T1 and closes them during T2 and T3. Switches 38A and 38B can be either opened or closed during T3, since switches 26A and 26B are open.

At the beginning of the auto-zeroing cycle during T1, switches 32A and 32B short-circuit the internal input conductors 3A and 3B of differential stage 2 together to $V_{BIAS3}$, and switches 26A and 26B are closed, as are switches 35A, 35B, 41A, and 41B. That is, all of the switches in FIG. 1 except 38A and 38B are closed during T1. The period T1 is long enough to allow voltage level shifting capacitors 34A and 34B to be precharged to a voltage equal to the difference between $V_{CASCODE}$ and the output voltage of servo amplifier 32. The voltages on conductors 30A and 30B will be slightly different due to the input offset voltage of servo amplifier 28 since the inputs to the servo amplifier 28 are shorted together to $V_{BIAS2}$.

During T2, switches 35A, 35B, 41A, and 41B are opened, while switches 26A, 26B, 32A, and 32B remain closed. Switches 38A and 38B can be either opened or closed. Switches 32A and 32B therefore continue to short-circuit the internal input conductors 3A and 3B of differential stage 2 during T2. This configuration during T2 allows servo amplifier 28 to provide negative feedback so as to minimize the differential output voltage $V_{OUT}$ by altering the voltage $V_{ADJUST}$ applied between the gates of compensation transistors 11 and 12.

During T3, switches 26A and 26B are open, and internal input conductors 3A and 3B are connected to external conductors 5A and 5B, respectively. Servo amplifier 28 therefore is isolated from S/H capacitors 27A and 27B, so the present optimum value of $V_{ADJUST}$ continues to be applied to the gates of adjustment transistors 11 and 12. Since switches 32A and 32B reconnect internal input conductors 3A and 3B to external conductors 5A and 5B, respectively, the differential input $V_{IN}=V_{IN}^{+}-V_{IN}^{-}$ is amplified to produce an output signal $V_{OUT}$ that is compensated for the input offset voltage of differential input stage 2.

Thus, the offset voltage of input stage 2 is amplified by its open loop gain to produce a "gained up" offset signal, which for the resistor load devices 23 and 24 shown in FIG. 1, is a gained up offset voltage. (If different load devices such as current mirror transistors or folded cascode transistors are used, the gained up offset signal could be a differential current representative of the input offset voltage.) In FIG. 1, the gained up offset voltage is applied by output conductors 21 and 22 between the (+) and (−) inputs of amplifier 25. The voltages sampled and held on capacitors 27A and 27B constitute a differential offset compensation voltage that is proportional to the input offset voltage. That differential offset compensation voltage is level shifted by capacitors 34A and 34B to produce $V_{ADJUST}^+$ and $V_{ADJUST}^-$ on conductors 13 and 14 and applied to the gates of MOSFETs 11 and 12, respectively.

Because of the opposite, unsymmetrical W/L ratios of the first pair of input MOSFETs 17 and 18 and the second pair of input MOSFETs 19 and 20, the differential compensation voltage $V_{ADJUST}=V_{ADJUST}^+-V_{ADJUST}^-$ applied between the gates of compensation MOSFETs 11 and 12 causes input stage 2 to adjust the value of $V_{OUT}$ between output conductors 21 and 22 to be zero while the input terminals 3A and 3B are short-circuited by switches 32A and 32B. Then, after switches 32A and 32B are opened, internal input terminals 3A and 3B receive a differential input voltage $V_{IN}=V_{IN}^+-V_{IN}^-$, and as long as the foregoing sampled and held offset compensation voltages $V_{ADJUST}^+$ and $V_{ADJUST}^-$ remain stored on capacitors 27A and 27B, they continue to be applied to the gates of compensation MOSFETs 11 and 12 and continue to effectively cancel the offset voltage of input stage 2.

Figure 1A:
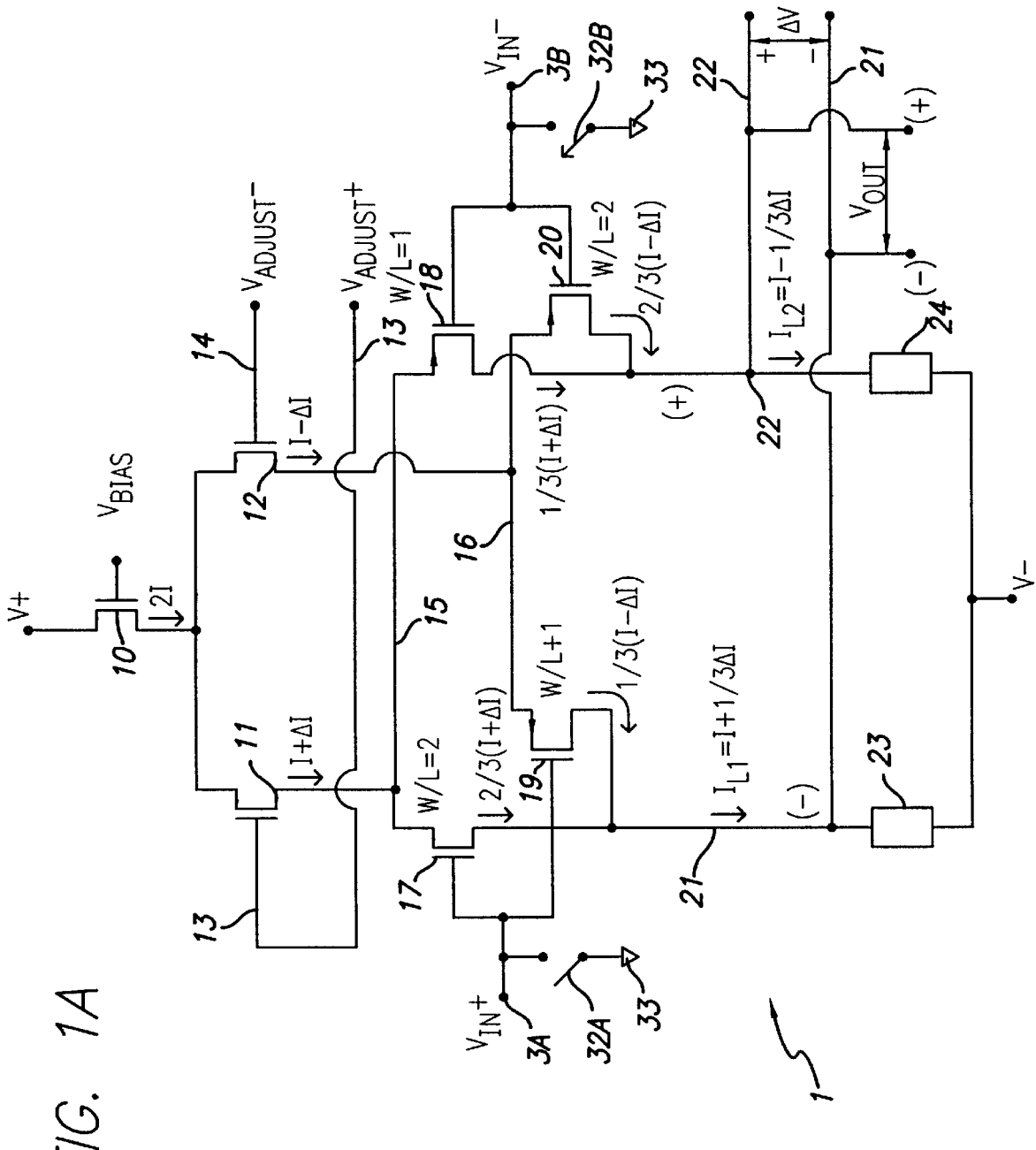
FIG. 1A is a schematic diagram of the differential input stage of FIG. 1 including arrows representing currents so as to aid in explanation of the operation of the invention.

To help in understanding how the pairs of asymmetrical input transistors 17,18 and 19,20 contribute to improved offset compensation, FIG. 1A has been provided to show the differential input stage of the amplifier of FIG. 1 with the ratio N set equal to 2. It will be assumed that there is an inherent output offset voltage due to the combination of mismatches that would exist in the pair of MOSFETs 11 and 12, the input stage including MOSFETs 17, 18, 19 and 20 and load resistors 23 and 24. The voltage $V_{ADJUST}=V_{ADJUST}^+-V_{ADJUST}^-$ then is applied to the gates of MOSFETs 11 and 12. To understand how the splitting of the current from constant current source MOSFET 10 into the two oppositely unbalanced pairs of input MOSFETs 17 and 18 and input MOSFETs 19 and 20 leads to improved offset compensation, it is helpful to assume that a constant current 2I is supplied by current source MOSFET 10 and that switches 32A and 32B are both connected to ground conductor 33. These assumed values are superimposed on the schematic diagram in FIG. 1A. The above mentioned assumed $V_{ADJUST}$ voltage causes an unequal split of the current 2I from MOSFET 10, so that current I+ΔI flows through compensation MOSFET 11 and the remaining current I−ΔI flows through compensation MOSFET 12.

The current I+ΔI then is further split into a current of (⅔)(I+ΔI) through input MOSFET 17 and (⅓) (I+ΔI) through input MOSFET 18, proportionately to the ratio N of 2:1 of the two W/L ratios. Similarly, the current I−ΔI in adjustment MOSFET 12 is further split into (⅓)(I−ΔI) through input MOSFET 19 and (⅔)(I−ΔI) through input MOSFET 20 according to the 1:2 ratio between their two W/L ratios. Then the current $I_{L1}$ through load device 23 is I+(⅓)ΔI, and the current $I_{L2}$ through load device 24 is I−(⅓)ΔI, as also shown in FIG. 1A. This results in a differential output voltage ΔV between conductors 21 and 22.

The division of the error current ΔI in the compensation transistors 11 and 12 to obtain the correction currents (ΔI)(N−1)/(N+1) in the output conductors 21 and 22 allows the capacitance, and hence the size, of the S/H capacitors 27A and 27B to be reduced by the same factor without increasing the kT/C switching noise currents in conductors 21 and 22 to values higher than they would be if the pairs of asymmetrical input transistors were not used.

Thus, the invention provides the two adjustment MOSFETs 11 and 12 operative to split the current from the constant current source 10 and direct the two resulting currents into two separate differential pairs of input transistors 17,18 and 19,20, respectively. The reversed, unbalanced W/L ratios between the first pair of input MOSFETs 17 and 18 and the second pair of input MOSFETs 19 and 20 allows the feedback signals $V_{ADJUS}^+$ and $V-_{ADJUST}^-$ to cancel the effect of the input offset voltage of differential input stage 2 by diminishing the amplitudes of the offset-caused error currents that flow through load devices 23 and 24.

Simulations of the circuit operation confirm that the above-described circuit configuration allows achievement of higher signal-to-noise ratios while using smaller sample-and-hold capacitors than prior similar auto-zeroing circuits such as the ones disclosed in the above mentioned U.S. Pat. No. 4,622,521 by Redfern. The use of the cascode MOSFETs, which usually are already present in MOSFET differential stages, to adjust input offset voltage in response to feedback signals allows this technique to be used in a comparator circuit where the feedback is positive, creating hysteresis.

The above described differential amplifier and auto-zeroing system avoids the need for laser trimming of thin film load resistors. Furthermore, the transconductance of differential input stage 2 is only slightly degraded by using the two oppositely mismatched pairs of input transistors. The charge injection which is always present in a switched capacitor circuit is mostly converted to a common mode signal that gets rejected. The circuit configuration of FIG. 1 is amenable to very efficient integrated circuit layouts.

Figure 2:
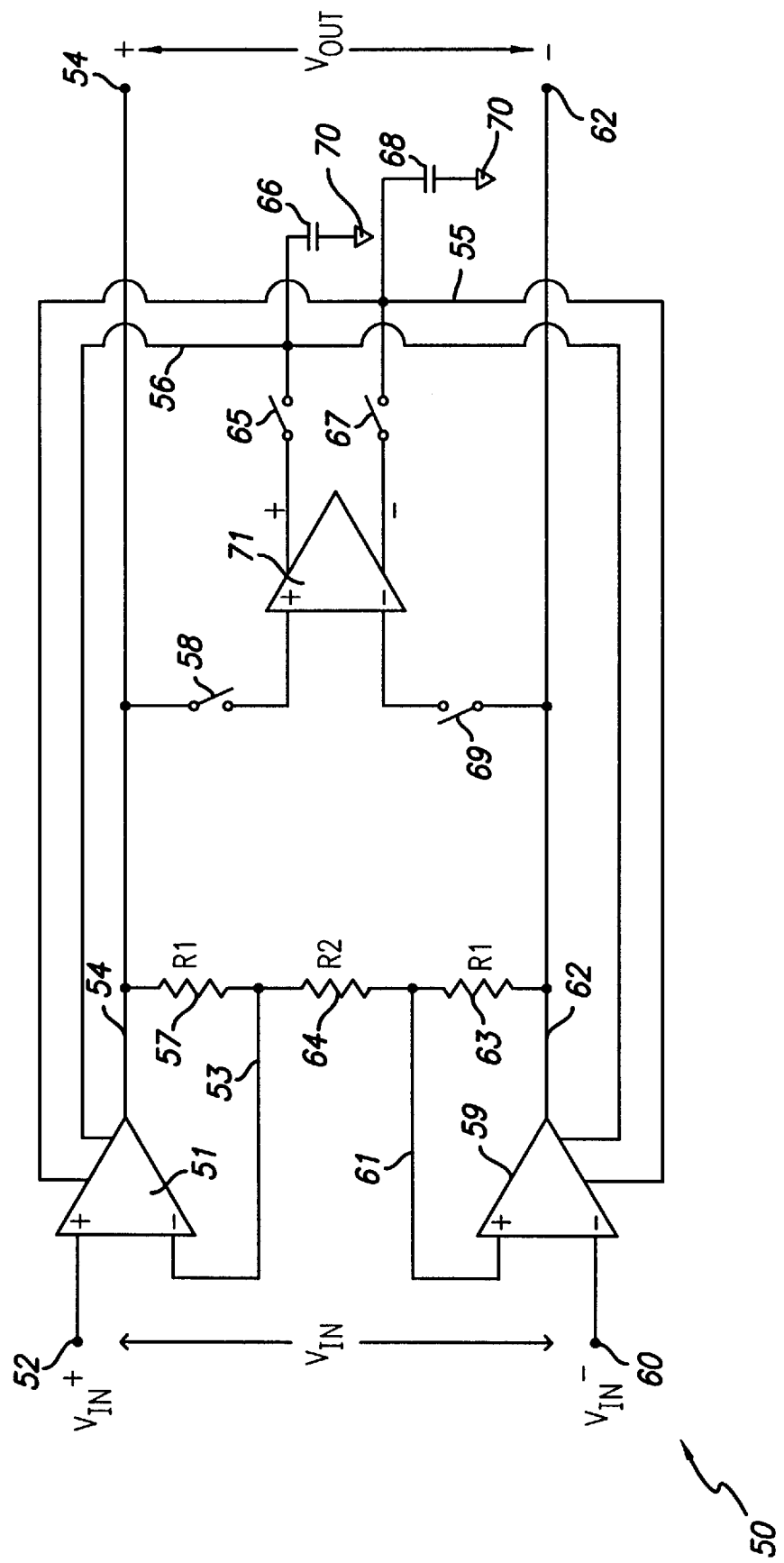
FIG. 2 is a schematic diagram of an instrumentation amplifier including two of the differential amplifiers shown in FIG. 1

Referring to FIG. 2, a particularly advantageous application of the differential amplifier 1 of FIG. 1 is shown, wherein instrumentation amplifier 50 includes three operational amplifiers 51, 59, and 71. Operational amplifiers 51 and 59 can be the same as operational amplifier 1 of FIG. 1. The (+) input of operational amplifier 51 is connected by input conductor 52 to receive an input voltage $V_{IN}^+$. The output of operational amplifier 51 is connected by conductor 54 to the (+) output terminal of instrumentation amplifier 50. A resistor 57 of resistance R1 is connected between conductor 54 and conductor 53, which is connected to the (−) input of operational amplifier 51. The (−) input of operational amplifier 59 is connected to input terminal 60 to receive input voltage $V_{IN}^-$. The output of operational amplifier 59 is connected by conductor 62 to the (−) output terminal of instrumentation amplifier 50. A resistor 63 of resistance R1 is connected between conductor 62 and conductor 61, which is connected to the (−) input of operational amplifier 59. A resistor 64 of resistance R2 is connected between conductors 53 and 61.

Operational amplifier 71 has its (+) input coupled by a switch 58 to conductor 54. The (−) input of operational amplifier 71 is connected by a switch 69 to conductor 62. The (+) output of operational amplifier 71 is connected by a switch 65 and conductor 56 to a first adjustment input of operational amplifier 51 and to a first adjustment input of operational amplifier 59. The (−) output of operational amplifier 71 is connected by a switch 67 and conductor 55 to a second adjustment input of operational amplifier 51 and a second input of operational amplifier 59. Conductor 56 is connected to one plate of a capacitor 66. The other plate of capacitor 66 is connected to a fixed reference voltage conductor 70. Conductor 55 is connected to one plate of capacitor 68, the other plate of which is connected to fixed reference voltage conductor 70. (Note that the resistors shown in FIG. 2 can be switched capacitor circuits that are equivalent to the resistors. Those skilled in the art of switched capacitor networks know that certain switched capacitor circuits are equivalent to resistors.) The autozeroing technique of the present invention in the instrumentation amplifier of FIG. 2 provides similar advantages of offset compensation for the entire instrumentation amplifier, and further corrects and balances "system level" inaccuracies such as those caused by charge injection and/or unbalanced circuit component values.

Note that the embodiments of the invention shown in FIGS. 1 and 2 use negative feedback from the output conductors 21 and 22 of differential stage 2 to generate $V_{ADJUST}$ so as to minimize or cancel the input offset voltage of differential stage 2.

Figure 4:
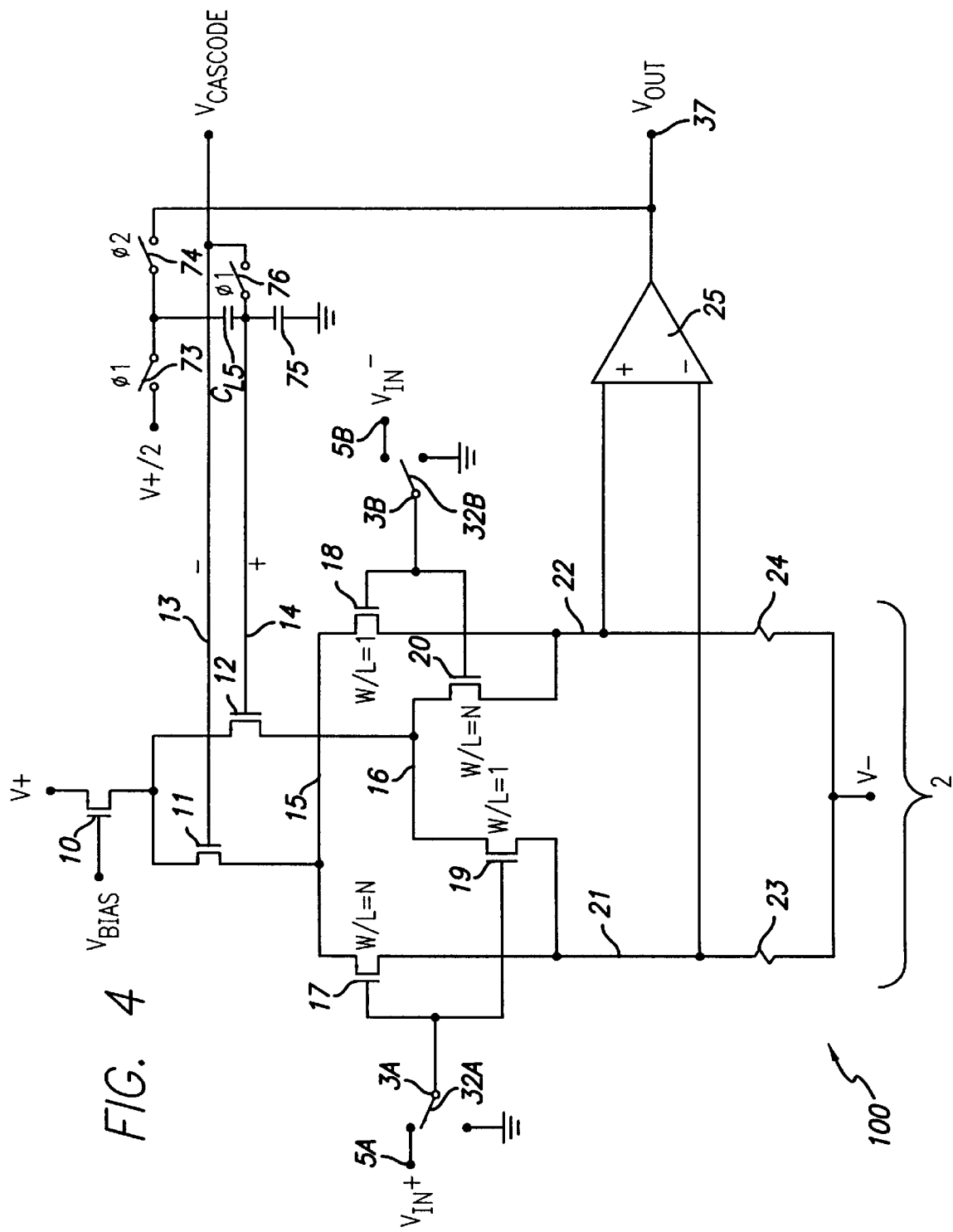
FIG. 4 is a block diagram of a comparator including the differential input stage of FIG. 1A.

FIG. 4 shows a comparator 100 using positive, rather than negative, feedback to vary $V_{ADJUST}$ so as to establish a predetermined hysteresis in comparator 100. Differential stage 2 of comparator 100 is essentially the same as in FIG. 1. The single-ended signal $V_{OUT}$ produced by amplifier 25 is coupled to a first terminal of φ2-actuated switch 74. The second terminal of switch 74 is connected to a first terminal of a voltage level-shifting capacitor $C_{LS}$ and to a first terminal of a φ1-actuated switch 73. The second terminal of level-shifting capacitor $C_{LS}$ is connected by conductor 14 to the gate of adjustment transistor 12, a first terminal of a φ1-actuated switch 76, and to a first terminal of a DC reference capacitor 75. Capacitor 75 holds the common-mode bias voltage $V_{CASCODE}$. A second terminal of switch 76 is connected by conductor 13 to the gate of adjustment transistor 11 and to $V_{CASCODE}$. The second terminal of switch 73 is coupled to V+/2. The second terminal of capacitor 75 is connected to ground. The arrangement shown in FIG. 4 provides positive feedback to the gates of adjustment transistors 11 and 12. Negative feedback can be provided by reversing the (+) and (−) inputs of amplifier 25.

As shown in FIG. 5, φ2 is at a "0" level during T1, and φ1 is at a "1" level for a shorter interval T1' within T1. During φ1, switches 73 and 76 are closed. When switch 76 is closed, both conductors 13 and 14 are at the bias voltage $V_{CASCODE}$. The closing of switch 73 charges the upper terminal of level-shifting capacitor $C_{LS}$ to V+/2 volts, so the voltage drop across $C_{LS}$ is equal to V+/2 minus $V_{CASCODE}$ volts.

During φ2, switch 74 is closed. The opening of switch 76 disconnects conductor 14 from $V_{CASCODE}$, while conductor 13 remains at $V_{CASCODE}$ volts. The closing of switch 74 connects $V_{OUT}$ to the upper terminal of level-shifting capacitor $C_{LS}$. This causes a voltage equal to $V_{OUT}$ minus the voltage drop across level-shifting capacitor $C_{LS}$ to be applied by conductor 14 to the gate of adjustment transistor 12. The feedback network in comparator 100 is independent of the input signal $V_{IN} = V_{IN}^+ - V_{IN}^-$. The amount of hysteresis is equal to:

$$\pm \frac{\Delta V_{OUT} \cdot C_{LS} \cdot gm2 \cdot (N-1)}{(C_{LS} + C_{75}) \cdot gm1 \cdot (N+1)},$$

where N is the ratio of the channel conductance of input transistor 17 to that of input transistor 18 and of input transistor 20 to that of input transistor 19, gm2 is the transconductance of the differential circuit that includes compensation transistors 11 and 12, and gm1 is the transconductance of the differential stage including input transistors 17, 18, 19 and 20.

The amount of hysteresis can be made adjustable in various ways, for example by a network that selectively switches additional amounts of capacitance in parallel with $C_{LS}$.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, feedback adjustment voltages from the sample-and-hold capacitors could be applied to "back gates", i.e, N-type wells in which P-channel MOSFETs 11 and 12 are formed, instead of the "top" gates as illustrated. (The well regions in which the source and drain regions of a MOSFET are formed constitute "back gates" to which control signals can be applied to modulate the channel conductivity of a MOSFET.) This would reduce the sensitivity of the differential input stage to $V_{ADJUST}$, and therefore would allow compensation voltages to be used which are larger relative to the capacitor switching noise, kT/C, associated with sample-and-hold capacitors 27A and 27B. This might allow use of still smaller sample-and-hold capacitors. The asymmetrical ratio N between the W/L ratios of input transistors 17 and 18 and between the W/L ratio of N between input transistors 20 and 19 accomplishes the same ratio N between the channel conductances of the respective transistors when they are turned on to the same degree. However, the channel ratio N could be achieved in various other ways than by ratioing the W/L parameters. For example, in FIG. 1 the gate electrodes of input transistors 17, 18, 19 and 20 can be considered to be either "top gates" or "back gates", and if the input signal $V_{IN}^+$ is applied to the "top gate" of input transistor 17 and the "back gate" of input transistor 18, an amount of channel conductance ratioing will occur. Another way of accomplishing the channel conductance ratioing would be to provide local ion implanting that changes the channel conductance of one of the two input transistors 17 and 18 but not the other. The present invention is intended to encompass any of the described circuit topologies regardless of how the asymmetrical effective ratioing of the input transistors is accomplished.

As another example, constant current source 37 shown in dotted lines in FIG. 1 can be connected by conductor 15 to the sources of asymmetrical input transistors 17 and 18, and similarly, constant current source 40 can be connected by conductor 16 to the sources of input transistors 19 and 20. These additional constant tail currents reduce the $g_m$ of the differential pairs of compensation transistors 11 and 12 relative to the $g_m$ of the input differential pairs 17,18 and 19,20, and therefore reduce the sensitivity of differential stage 2 to $V_{ADJUST}$.

What is claimed is:

1. An adjustable offset amplifier circuit, comprising:
   (a) a current source;
   (b) first and second offset adjustment transistors each having a first electrode coupled to the current source and a control electrode, a first offset adjustment signal being applied to the control electrode of at least one of the first and second offset adjustment transistors;
   (c) first and second input transistors each having a first electrode coupled to a second electrode of the first offset adjustment transistor;
   (d) third and fourth input transistors each having a first electrode coupled to a second electrode of the second offset adjustment transistor, the W/L ratios of the first and second input transistors being related by a predetermined ratio, the W/L ratios of the fourth and third input transistors being related by the predetermined ratio, a control electrode of each of the first and third input transistors being coupled to a first input terminal, a control electrode of each of the second and fourth input transistors being coupled to a second input terminal;
   (e) a second electrode of each of the first and third input transistors being coupled by a first output conductor to a first load device; and
   (f) a second electrode of each of the second and fourth input transistors being coupled by a second output conductor to a second load device, the adjustable offset amplifier producing an output signal conducted by at least one of the first and second output conductors.

2. The adjustable offset amplifier circuit of claim 1 wherein the first offset adjustment signal is applied to the control electrode of the first offset adjustment transistor, and a second offset adjustment signal is applied to the control electrode of the second offset adjustment transistor.

3. The amplifier stage of claim 1 including a feedback circuit coupled between at least one of the first and second output conductors and the control electrode of at least one of the first and second offset adjustment transistors.

4. The amplifier stage of claim 3 wherein the feedback circuit provides negative feedback from at least one of the first and second output conductors to the control electrode of at least one of the first and second offset adjustment transistors.

5. The amplifier stage of claim 3 wherein the feedback circuit provides positive feedback from at least one of the first and second output conductors to the control electrode of at least one of the first and second offset adjustment transistors.

6. An amplifier circuit, comprising:
   (a) a current source;
   (b) first and second cascode transistors each having a first electrode coupled to the current source and a control electrode, a first adjustment signal being applied to the control electrode of at least one of the first and second cascode transistors;
   (c) first and second input transistors each having a first electrode coupled to a second electrode of the first cascode transistor;
   (d) third and fourth input transistors each having a first electrode coupled to a second electrode of the second cascode transistor, the W/L ratios of the first and second input transistors being related by a predetermined ratio, the W/L ratios of the fourth and third input transistors being related by the predetermined ratio a control electrode of each of the first and third input transistors being coupled to a first input terminal, a control electrode of each of the second and fourth input transistors being coupled to a second input terminal;
   (e) a second electrode of each of the first and third input transistors being coupled by a first output conductor to a first load device; and
   (f) a second electrode of each of the second and fourth input transistors being coupled by a second output conductor to a second load device.

7. The amplifier circuit of claim 6 wherein the first adjustment signal is applied to the control electrode of the first cascode transistor, and a second adjustment signal is applied to the control electrode of the second cascode transistor.

8. An offset-compensated amplifier, comprising:
   (a) an input stage including
      i. a current source, and first and second compensation transistors each having a first electrode coupled to the current source,
      ii. first and second input transistors each having a first electrode coupled to a second electrode of the first compensation transistor, and third and fourth input transistors each having a first electrode coupled to a second electrode of the second compensation transistor, the W/L ratios of the first and second input transistors being related by a predetermined ratio, the W/L ratios of the fourth and third input transistors being related by the predetermined ratio, a second electrode of each of the first and third input transistors being coupled by a first output conductor to a first load device, and a second electrode of each of the second and fourth input transistors being coupled by a second output conductor to a second load device, a control electrode of each of the first and third input transistors being coupled to a first input terminal, a control electrode of each of the second and fourth input transistors being coupled to a second input terminal; and
   (b) auto-zeroing circuitry coupled to the first and second input terminals and the first and second output conductors, including switching circuitry operative to short-circuit the first and second input terminals together to cause the input stage to produce an offset signal between the first and second output conductors, switched capacitor circuitry operative to store a signal representative of the offset signal, and compensation circuitry operative to apply compensation signals to the control electrodes of the first and second compensation transistors in response to the stored offset signal.

9. An offset-compensated amplifier, comprising:
   (a) a current source;
   (b) first and second compensation transistors each having a first electrode coupled to the second current source;
   (c) first and second input transistors each having a first electrode coupled to a second electrode of the first compensation transistor, and third and fourth input transistors each having a first electrode coupled to a second electrode of the second compensation transistor, the W/L ratios of the first and second input transistors being related by a predetermined ratio, the W/L ratios of the fourth and third input transistors being related by the predetermined ratio;
   (d) a second electrode of each of the first and third input transistors being coupled by a first output conductor to a first load device, and a second electrode of each of the second and fourth input transistors being coupled by a second output conductor to a second load device;

(e) a control electrode of each of the first and third transistors being coupled to a first input terminal, a control electrode of each of the second and fourth transistors being coupled to a second input terminal;

(f) first and second auto-zeroing switches operative to short-circuit the first and second input terminals together;

(g) third and fourth auto-zeroing switches operative to store voltages on the first and second output conductors on a first capacitor and a second capacitor, respectively; and (h) circuitry receiving the voltages stored on the first and second capacitors and applying corresponding compensation voltages to control electrodes of the first and second compensation transistors, respectively.

10. The offset-compensated amplifier of claim 9, including a first differential amplifier having first and second inputs coupled to the first and second output conductors, respectively, and first and second outputs coupled to the third and fourth auto-zeroing switches, respectively.

11. The offset-compensated amplifier of claim 10 including a second differential amplifier having first and second inputs coupled to the first and second outputs of the first differential amplifier, respectively, and first and second outputs coupled to the third and fourth auto-zeroing switches, respectively.

12. The offset-compensated amplifier of claim 9 wherein each of the first and second compensation transistors and each of the first, second, third, and fourth input transistors is a field effect transistor, and wherein each first electrode thereof is a source electrode, each second electrode is a drain electrode, and each control electrode is a gate electrode.

13. A method of compensating the input offset voltage of an amplifier, comprising:

(a) splitting a tail current into a first current flowing through a first MOSFET and a second current flowing through a second MOSFET;

(b) splitting the first current into a third current flowing through a first input MOSFET having its gate connected to a first input terminal and a fourth current flowing thorough a second input MOSFET having its gate connected to a second input terminal, and splitting the second current into a fifth current flowing through a third input MOSFET having its gate connected to the first input terminal and a sixth current flowing through a fourth input MOSFET having its gate connected to the second input terminal, the W/L ratios of the first and second input MOSFETs being related by a predetermined ratio, the W/L ratios of the fourth and third input MOSFETs being related by the predetermined ratio;

(c) directing the third and fifth currents to flow through a first output conductor into a first load device and directing the fourth and sixth currents to flow through a second output conductor into a second load device;

(d) short-circuiting the first and second input terminals to a predetermined voltage to cause a gained-up offset voltage to be developed between the first and second output conductors;

(e) storing a voltage representative of the gained-up offset voltage in a sample-and-hold circuit; and (f) producing an adjustment voltage representative of the sampled and held gained-up offset voltage and applying the adjustment voltage between the gates of the first and second MOSFETs to cause the amplifier to operate to reduce the gained-up offset voltage.

14. The method of claim 13 wherein step (e) includes amplifying the gained-up offset voltage to produce the voltage representative of the gained-up offset voltage and sampling it onto and holding it in a capacitive sample-and-hold circuit.

15. The method of claim 14 wherein step (f) includes amplifying the sampled and held voltage to produce the adjustment voltage.

16. The method of claim 15 including performing the amplifying of the gained-up offset voltage by means of a first differential amplifier to produce the voltage as a difference between a first inverted output voltage and storing it on a first capacitor and a first non-inverted output voltage and storing it on a second capacitor.

17. An adjustable offset amplifier circuit, comprising:

(a) a current source;

(b) first and second compensation transistors each having a first electrode coupled to the second current source;

(c) first and second input transistors each having a first electrode coupled to a second electrode of the first compensation transistor, and third and fourth input transistors each having a first electrode coupled to a second electrode of the second compensation transistor, the W/L ratios of the first and second input transistors being related by a predetermined ratio, the W/L ratios of the fourth and third input transistors being related by the predetermined ratio;

(d) a second electrode of each of the first and third input transistors being coupled by a first output conductor to a first load device, and a second electrode of each of the second and fourth input transistors being coupled by a second output conductor to a second load device;

(e) a control electrode of each of the first and third transistors being coupled to a first input terminal, a control electrode of each of the second and fourth transistors being coupled to a second input terminal; and (f) offset control circuitry producing at least one control voltage in response to an offset adjustment signal and applying the control voltage to a control electrode of one of the first and second compensation transistors, respectively.

18. The adjustable offset amplifier circuit of claim 17 wherein the offset control circuitry produces the control signal as positive feedback in response to an output signal between the first and second output conductors.

19. The adjustable offset-compensated amplifier circuit of claim 17 wherein the offset-compensated amplifier circuit is a comparator having hysteresis.

* * * * *